United States Patent
Coles et al.

(10) Patent No.: US 7,167,371 B2
(45) Date of Patent: *Jan. 23, 2007

(54) LOW PROFILE LATCH ACTIVATOR

(75) Inventors: Henry C. Coles, Saratoga, CA (US);
Hector Vidales, Campbell, CA (US);
Joseph R. Allen, Tomball, TX (US);
Tri Nguyen, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 177 days.

This patent is subject to a terminal disclaimer.

(21) Appl. No.: 10/630,565

(22) Filed: Jul. 30, 2003

(65) Prior Publication Data

US 2004/0022034 A1 Feb. 5, 2004

Related U.S. Application Data

(63) Continuation of application No. 09/995,887, filed on Nov. 28, 2001, now Pat. No. 6,633,486.

(51) Int. Cl.
*G06F 1/16* (2006.01)

(52) U.S. Cl. ............... 361/726; 360/137; 312/223.1

(58) Field of Classification Search ......... 361/724–727, 361/680–687; 360/137, 97.01, 98.01; 170/237; 312/223.1–223.2; 174/52.1; 439/447; 364/78.1
See application file for complete search history.

(56) References Cited

U.S. PATENT DOCUMENTS

| | | | | |
|---|---|---|---|---|
| 5,829,601 A | * | 11/1998 | Yurchenco et al. | 211/41.17 |
| 6,266,248 B1 | * | 7/2001 | Hanas et al. | 361/752 |
| 6,285,555 B1 | * | 9/2001 | O'Neal et al. | 361/727 |
| 6,571,340 B1 | * | 5/2003 | Lee | 713/300 |
| 6,633,486 B2 | * | 10/2003 | Coles et al. | 361/726 |

* cited by examiner

*Primary Examiner*—Hung Van Duong

(57) ABSTRACT

A technique is provided for coupling and uncoupling modular devices with electronic and computing devices. A latch is coupled to a release member, which operates to release the latch from a mate latch by bending the release member to move the latch laterally away from the mate latch. The release member also may have grips for tool-lessly bending the release member to release the latch from the mate latch, and for removing the desired device. The technique also may embody a modular device having the latch and release member, or it may embody an overall system having the modular device disposed in a receptacle.

29 Claims, 8 Drawing Sheets

LOW PROFILE LATCH ACTIVATOR

This is a continuation of application Ser. No. 09/995,887, filed Nov. 28, 2001, now U.S. Pat. No 6,633,486.

FIELD OF THE INVENTION

The present technique relates generally to the field of computer systems and, more specifically, to a unique latch and release mechanism for a modular device. The present technique comprises a movable tool-less release assembly for simultaneously releasing a latch and removing the modular device from a receptacle.

BACKGROUND OF THE INVENTION

Computer systems generally include a computer housing having a motherboard, a processor, a hard drive, random access memory (RAM), a disk drive (e.g., a floppy drive, a CD-ROM drive, a DVD-ROM drive, a tape drive, etc.), communication ports, a cooling system (e.g., a fan), a power supply, a modem, a network device, an audio assembly (e.g., a sound card, a speaker, etc.), and various other devices. Many of these devices have a modular housing or structure, which is removably inserted into a device slot in the computer system. In desktop computers, these modular devices are typically attached to the computer chassis via screws. In portable computers, these modular devices may be attached via screws or a combination of latches and release mechanisms. For example, the modular device may have a lever to release a latch mechanism, while the portable computer has a lever to push the modular device out of the device slot. In servers and other large-scale systems, a plurality of modular devices may be inserted into adjacent slots, making it difficult to use any sort of quick release mechanism. For example, the server may have multiple fans disposed side by side. Due to limited space, lateral latch and release mechanisms may not be possible for such a configuration.

Accordingly, a technique is needed for releasing a modular device from an accessible side of the modular device. More particularly, it would be advantageous to provide a tool-free release assembly, which may be activated to release a tool-free latch assembly for the modular device. It would also be advantageous to incorporate a device release mechanism into the tool-free release assembly to facilitate physical removal of the modular device from a receptacle.

SUMMARY OF THE INVENTION

A technique is provided for coupling and uncoupling modular devices with electronic and computing devices. A latch is coupled to a release member, which operates to release the latch from a mate latch by bending the release member to move the latch laterally away from the mate latch. The release member also may have grips for toollessly bending the release member to release the latch from the mate latch, and for removing the desired device. The technique also may embody a modular device having the latch and release member, or it may embody an overall system having the modular device disposed in a receptacle.

In one aspect, the present technique provides an attachment system for a modular component of a computing device. The attachment system comprises a latch member having a mechanical latch and a flexible release member movably coupled to the latch member. The flexible release member also includes a grip for bending the flexible release member to effectuate a movement of the mechanical latch to a released position.

In another aspect, the present technique provides a modular component for a computer system. The modular component comprises a modular housing having an accessible side and a lateral side. A flexible and graspable release member is coupled to the accessible side, while a low profile latch is coupled to the lateral side. The flexible and graspable release member is also movably coupled to the low profile latch between the accessible and lateral sides.

In another aspect, the present technique provides a method of forming a tool-free connector for modular computing components. The method comprises providing a first flexible member having a latch and providing a second flexible member having a finger grip. The method also includes rotatably coupling free ends of the first and second flexible members to facilitate release of the latch.

BRIEF DESCRIPTION OF THE DRAWINGS

The invention will hereafter be described with reference to the accompanying drawings, wherein like reference numerals denote like elements, and.

DETAILED DESCRIPTION OF SPECIFIC EMBODIMENTS

As described in detail below, the present technique provides a unique latch and release mechanism, which may be utilized in a variety of electronics and computing devices, such as desktop computers, laptops, notebooks, PDAs, servers, or any other desired device. An exemplary system 10 in accordance with certain aspects of the present technique is illustrated in FIGS. 1 and 2, which are perspective views of a modular device 12 inserted into, and removed from, a receptacle 14 of an electronic device 16.

As discussed in detail below, the modular device 12 may embody any desired electrical mechanical device, such as a disk drive (e.g., a CD-drive, a DVD-drive, a CD RW drive, a floppy drive, a hard drive, etc.), a fan or cooling module, a memory module, a processor module, a device card (e.g., an ISA card, an EISA card, a PCI card, a PCMCIA card, etc.), a power supply module, a circuit board, and various other electrical, mechanical and computing modules. The receptacle 14 may embody a single device slot or bay, a multidevice receptacle, an electrical connection slot or plug, or any other suitable receptacle. The electronic device 16 may embody any desired electrical, mechanical or computing device, including those devices and systems described above. Moreover, the present technique may embody the entire electronic device 16, the modular device 12, or it may simply embody the unique latching and release features illustrated and described in the following Figures. The system 10 and modular device 12 also may include various circuitry, software and components to facilitate insertion and removal of the modular device 12 during operation of the electronic device 16. For example, hot-plug circuitry and software maybe integrated into the system 10 and/or the modular device 12.

Figure 1:
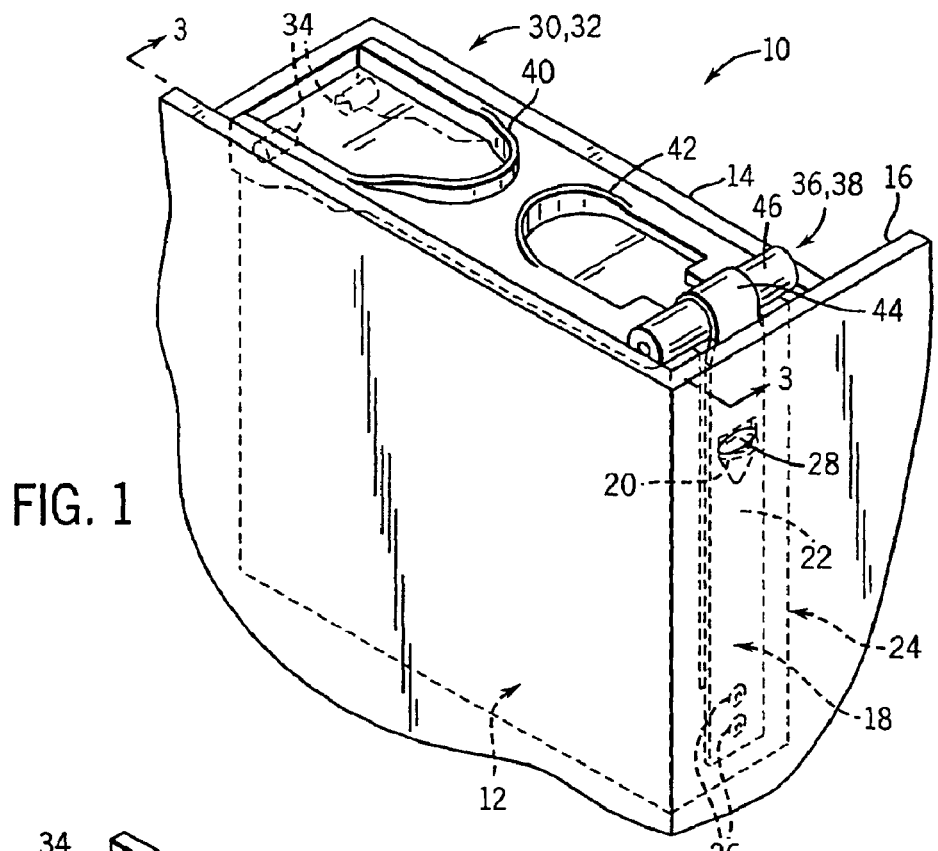
FIG. 1 is a perspective view of an exemplary system incorporating unique attachment and release mechanisms of the present technique.
Figure 3:
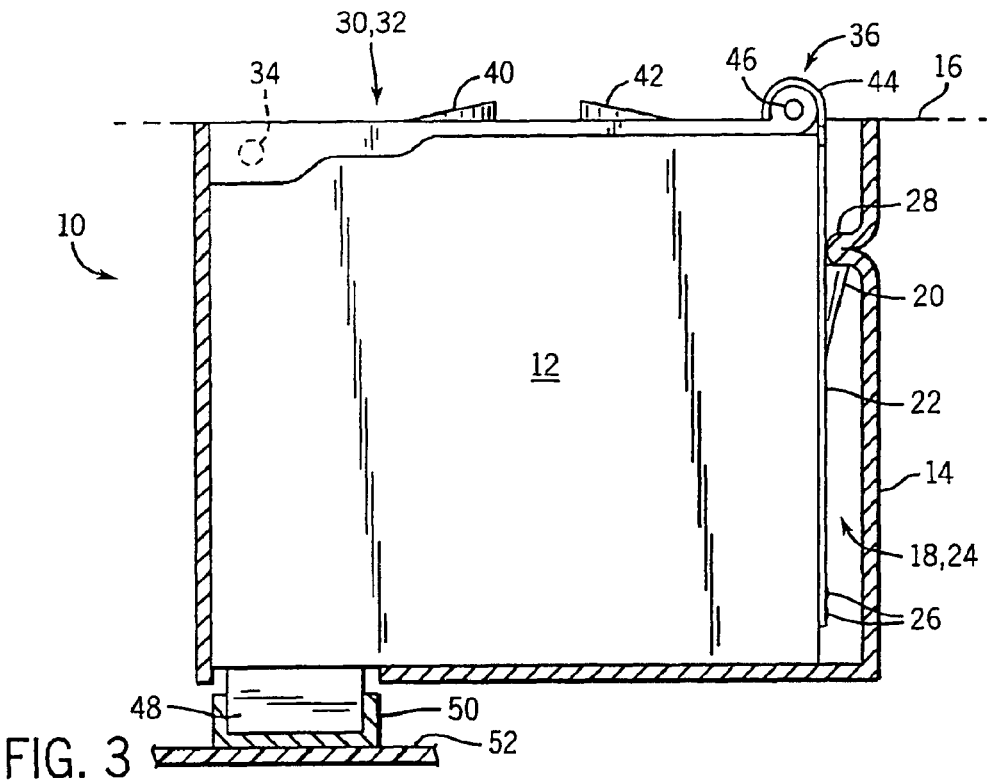
FIG. 3 is a side view of the modular device latched within the receptacle.

As illustrated in FIGS. 1 and 3, the modular device 12 is coupled to the receptacle 14 via a latch assembly 18, which has a latch structure 20 disposed on a movable latch member 22. The movable latch member 22 may embody a flexible structure, such as a flexible plastic or metal, or it may embody any other suitable laterally activated latch mechanism. For example, the latch assembly 18 may comprise a spring assembly, a linear positioning assembly, or other laterally movable mechanisms to facilitate movement of the latch structure 20 inwardly and outwardly from the modular device 12. However, in this exemplary embodiment, the movable latch member 22 embodies a flexible structure. The movable latch member 22 is coupled to a lateral section 24 of the modular device 12 via connectors 26, which may embody screws, rivets, adhesive, welding or any other suitable connection mechanism. The movable latch member 22 may be coupled to the lateral section 24 in any suitable location to facilitate movement (i.e., bending and linear movement) of the movable latch member 22 and the corresponding latch structure 20. In the mounted orientation of FIG. 1, the latch structure 20 is removably coupled to a mating latch structure 28 disposed in the receptacle 14. This latch connection is released by engaging a release assembly 30 (see FIGS. 4 and 5), which is disposed on an accessible section 32 of the modular device 12.

Figure 2:
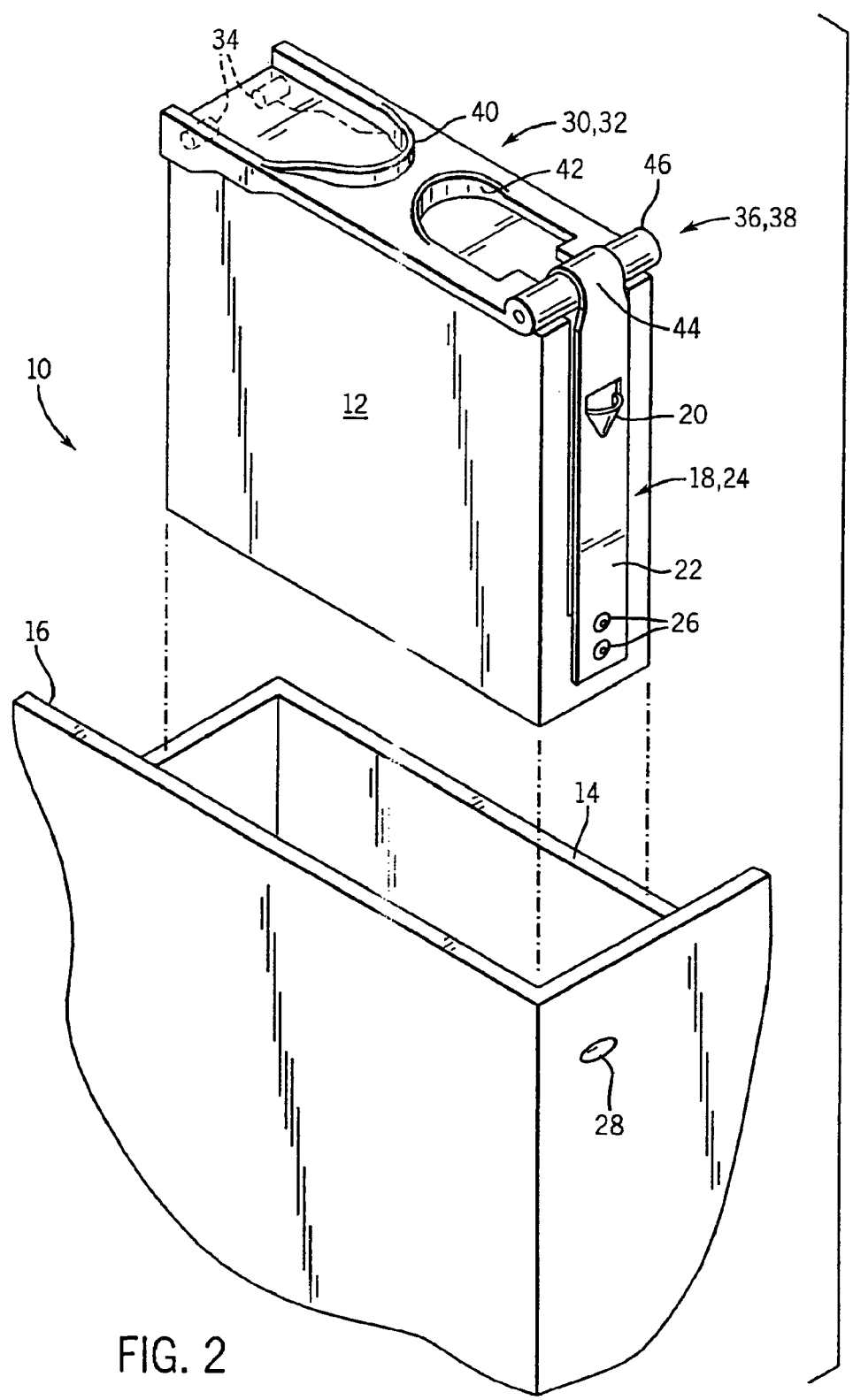
FIG. 2 is a perspective view of an exemplary modular device exploded from a receptacle of the system.

As illustrated in FIGS. 1 and 2, the release assembly 30 is rotatably coupled to the modular device 12 via hinge structures 34. The release assembly 30 is also rotatably coupled to the latch assembly 18 via a hinge structure 36, which is formed between the latch and release assemblies 18 and 30 at an edge 38 between the lateral and accessible sections 24 and 32, respectively. As illustrated, the hinge structure 36 is formed by a loop portion 24 of the movable latch member 22 being wrapped around a rod portion 46 of the release assembly 30. However, the hinge structures 34 and 36 may embody any suitable movable joints or hinges, such as a pin and hole mechanism, a rod and loop mechanism, a ball and socket mechanism, or any other mechanisms. In this exemplary embodiment, the release assembly 30 also embodies a flexible material, such as a flexible plastic or metal, and includes grips 40 and 42 to facilitate bending of the release assembly 30. For example, the grips 40 and 42 may be used to flex the release assembly 30 to a desired bent geometry, such as a U-shaped geometry, a concave geometry, a convex geometry, an S-shaped geometry, or a partially bent geometry, thereby moving at least one end of the release assembly 30.

Figure 4:
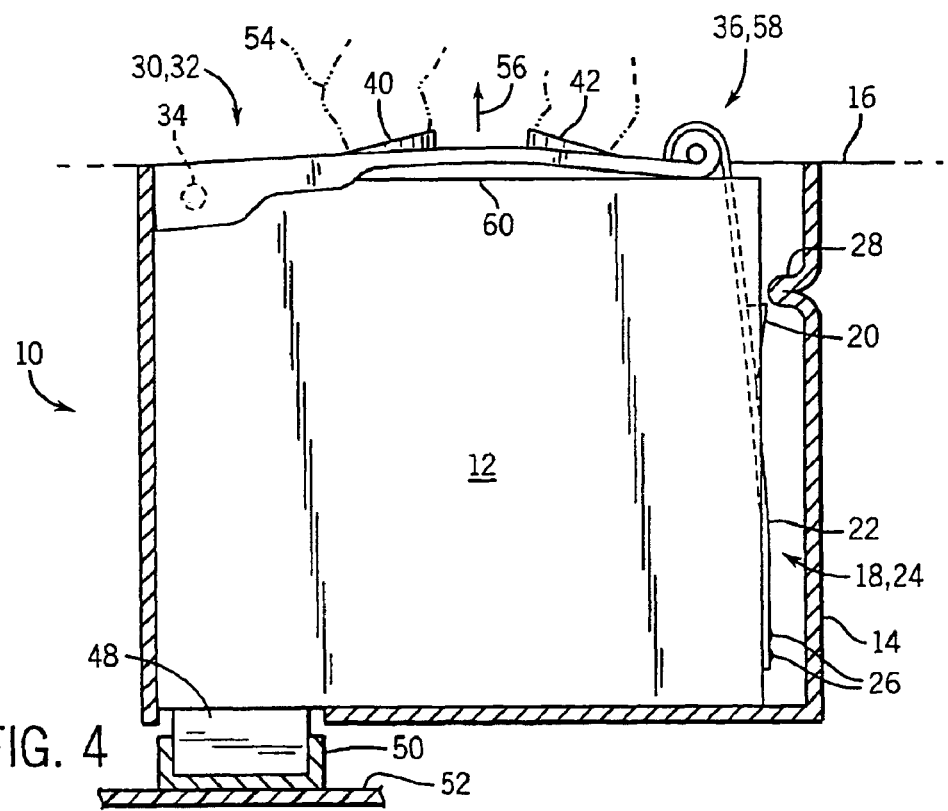
FIG. 4 is a side view of the modular device being unlatched from the receptacle.
Figure 5:
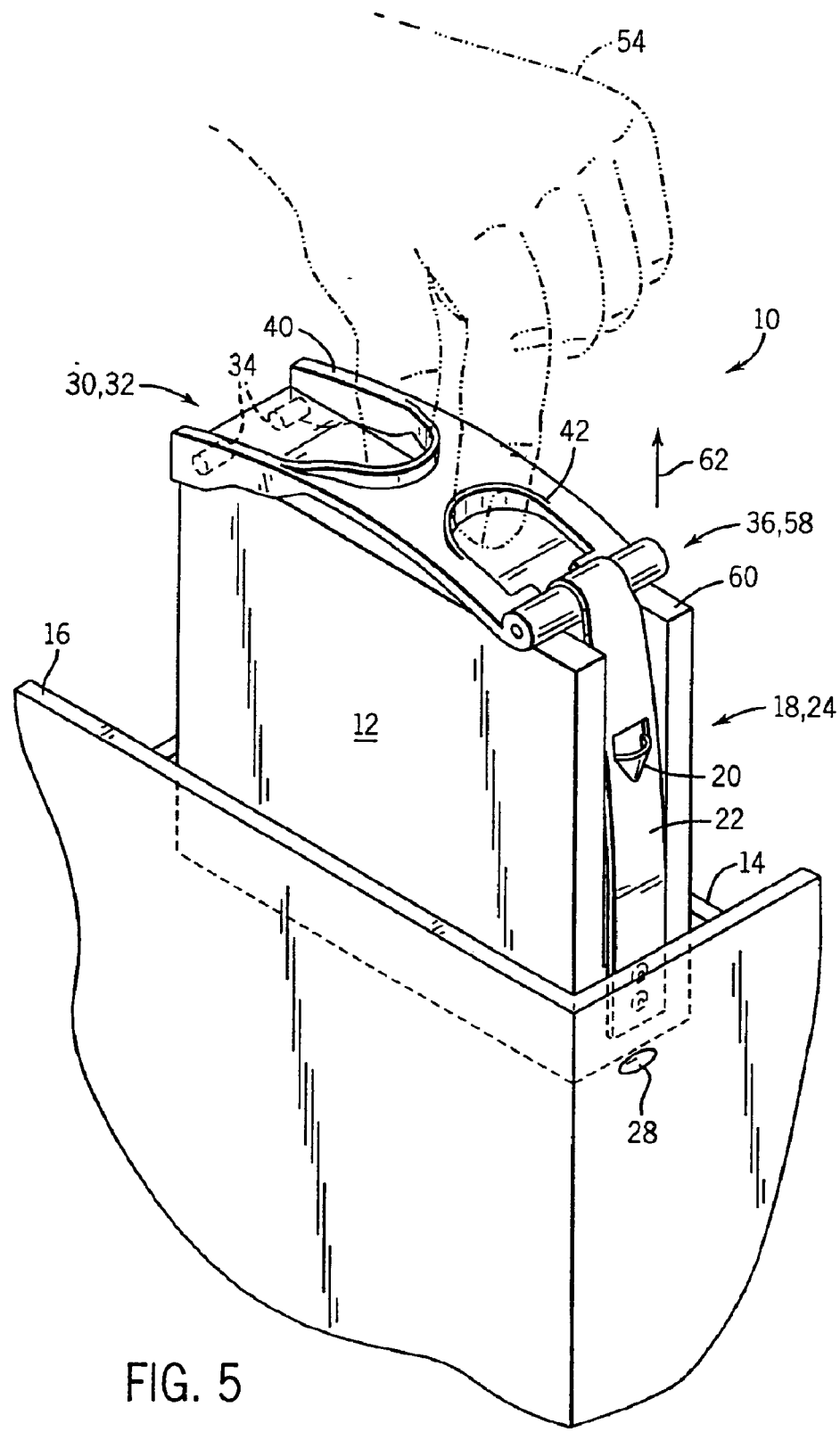
FIG. 5 is a perspective view of the modular device being physically removed from the receptacle.

Accordingly, as illustrated in FIGS. 3 through 5, the modular device 12 may be removed from the receptacle 14 by engaging the release assembly 30 to release the latch connection and physically remove the modular device. In an unbent orientation of the release assembly 30, the latch structure 20 is interlocked with the mating latch structure 28, as illustrated by the cross-sectional side view of FIG. 3. An electrical connection is also formed between electrical connectors 48 and 50, which are disposed on the modular device 12 and a circuit board 52 of the electronic device 16, respectively. The electrical connection provides power and any other desired control signals for the modular device 12. One or both of the electrical connectors 48 and 50 also may have a semi-loose mount mechanism to facilitate a smooth mount and dismount, mate and unmate (e.g., a blind mating mechanism) of the modular device 12 and corresponding electrical connection formed by the electrical connectors 48 and 50. It also should be noted that the flexible embodiments of the latch and release assemblies 18 and 30 provide a spring force to ensure that the latch structure 20 remains interlocked with the mating latch structure 28.

This latch connection is released by engaging the release assembly 30, as illustrated by the cross-sectional side view of FIG. 4. As a user 54 engages the grips 40 and 42 and pulls the release assembly 30 upwardly away from the receptacle 14, as indicated by arrow 56, the release assembly 30 bends between the hinge structures 34 and 36 and a free end 58 of the release assembly 30 moves along an edge 60 of the accessible section 32. The release assembly 30 may be partially or fully bent to a curved geometry, such as a u-shaped geometry, an n-shaped geometry, or a concave or convex geometry. The foregoing movement of the free end 58 also causes the movable latch member 22 to move inwardly away from the mating latch structure 28. Accordingly, the movable latch member 22 is laterally activated or operated (i.e., engaged or released) by the release assembly 30, which is outwardly bendable or bowable in at least a portion of the release assembly 30. As the movable latch member 22 is moved inwardly, the latch structure 20 is released from the mating latch structure 28, as illustrated in FIG. 4. The modular device 12 is then removed from the receptacle 14 by continuing to pull upwardly with the grips 40 and 42, as illustrated by the perspective view of FIG. 5 and indicated by arrow 62. At the same time, the electrical connector 48 disengages from the electrical connector 50. Finally, the modular device 12 is completely dismounted from the receptacle 14 of the electronic device 16, as illustrated in FIG. 2. It also should be noted that the latch and release assemblies 18 and 30 may embody any suitable bendable or movable structures, such as inwardly/outwardly movable, flexible, bowable, or bendable structures.

Figure 6:
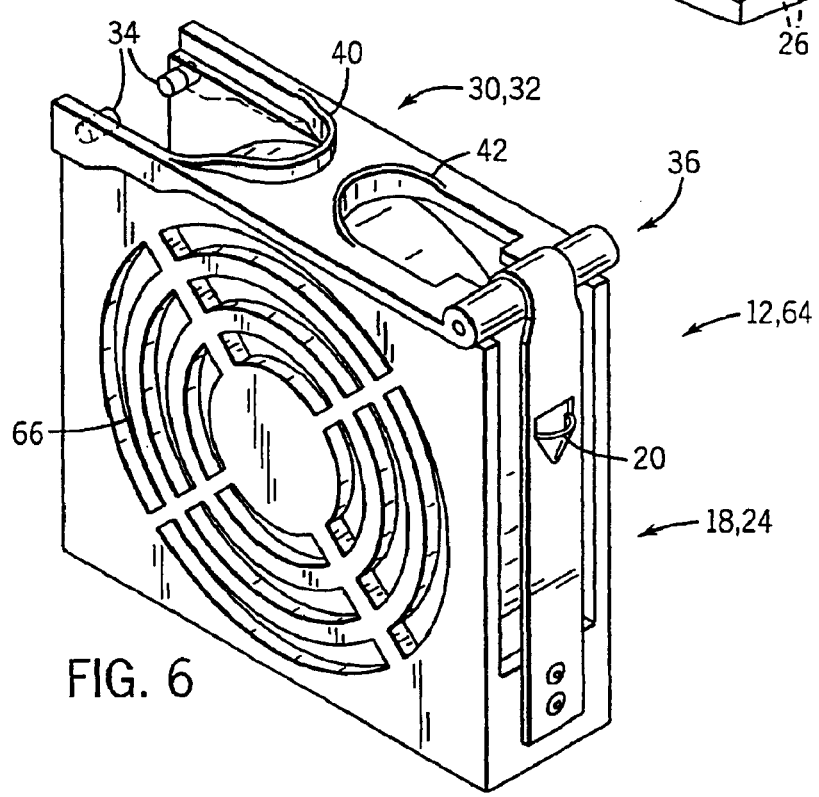
FIG. 6 is a perspective view of an exemplary embodiment of the modular device as a cooling assembly.

As mentioned above, the modular device 12 may embody a variety of electrical, mechanical, and computing components within the scope of the present technique. For example, the modular device 12 may embody a cooling or fan assembly 64, as illustrated by the perspective view of FIG. 6. In this exemplary embodiment, an airflow grill 66 is disposed on opposite sides of the modular device 12, while a cooling or fan device is disposed within the modular device 12. The unique aspects of the latch and release assemblies 18 and 30 allow a plurality of these cooling or fan assemblies 64 to be mounted side-by-side in the desired electronic device 16, thereby increasing the overall cooling capacity for the desired electronic device 16.

Figure 7:
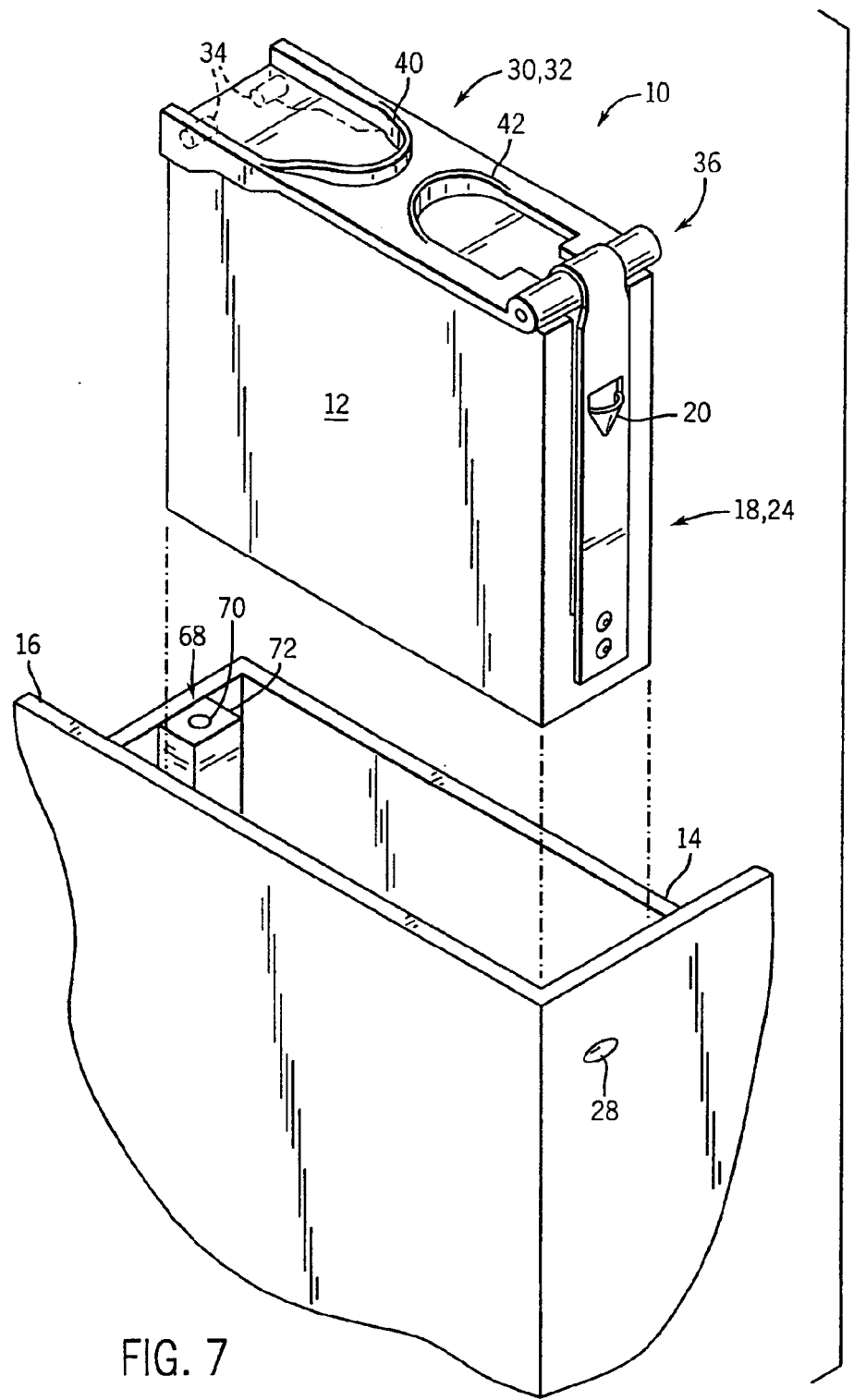
FIG. 7 is a perspective view of an alternate embodiment of the system having a status indicator disposed in the receptacle.
Figure 8:
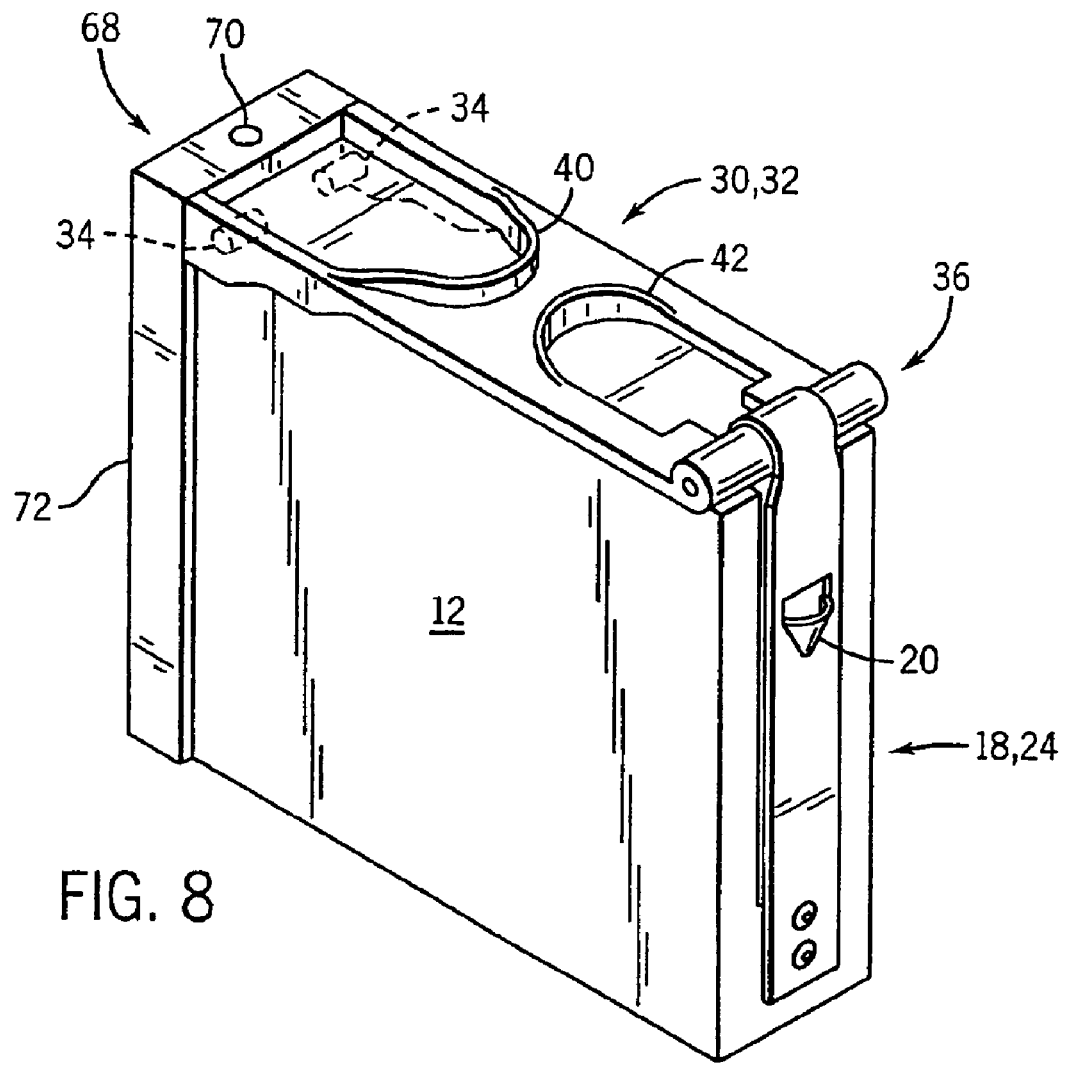
FIG. 8 is a perspective view of an alternate embodiment of the system having the status indicator coupled to the modular device.
Figure 9:
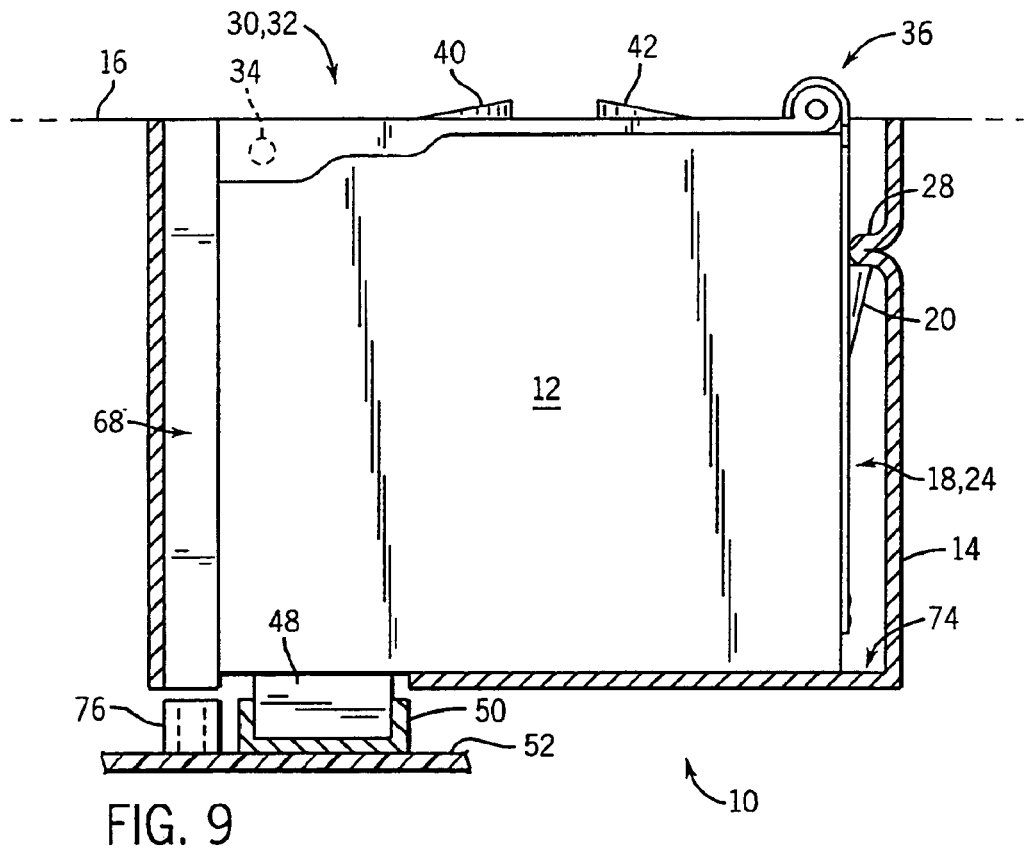
FIG. 9 is a side view of an alternate embodiment of the system having the modular device and the status indicator disposed in the receptacle.
Figure 10:
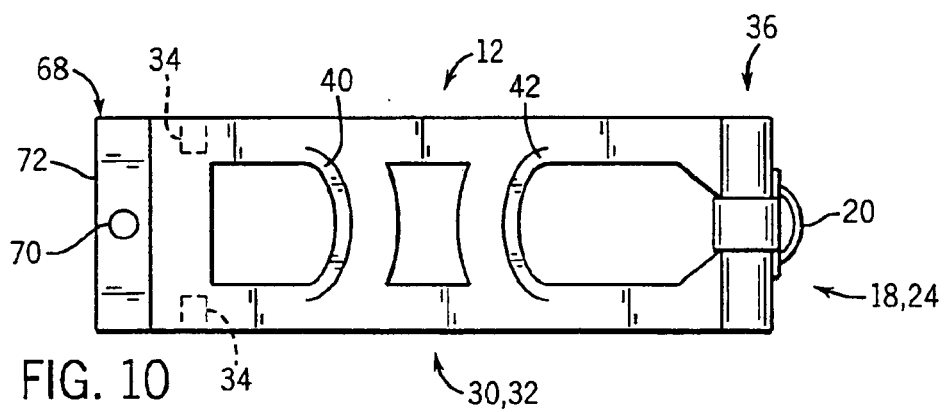
FIG. 10 is a top view of the modular device and the status indicator illustrated in FIG. 9.

The system 10 also may comprise various other electrical, mechanical, and computing features, such as illustrated in FIGS. 7 through 10. For example, the system 10 may include a status indicator 68 for the modular device 12. This status indicator 68 may be incorporated into the receptacle 14 as illustrated in FIG. 7, into the modular device 12 as illustrated in FIG. 8, or into any desired location within the electronic device 16. Depending on the features of the modular device 12, the status indicator 68 may provide a power status, a free/busy status, or any other desired operational status. Moreover, the status indicator 68 may include one or more status indicator lights 70 disposed in any of the foregoing positions. The status indicator 68 also may embody a signal transmission assembly 72, such as a light pipe or electrical circuitry, for transmitting a status signal from an adjacent indicator light or circuit board. The signal transmission assembly 72 may be disposed along the depth of the modular device 12 or along the receptacle 14, as illustrated in FIGS. 7 and 8, respectively. In either configuration, an indicator light or circuitry (e.g., an electrical plug, a wireless connector such as a fiber optic connector, a spring-loaded electrical contactor assembly, etc.) may be disposed at a base of the receptacle 14 to transmit a desired status signal to the user in a desired viewing location, such as the accessible section 32 of the modular device 12. For example, the desired status signal may be transmitted from the circuit board 52, through the electrical connectors 48 and 50, and to the status indicator light 70 via the signal transmission assembly 72.

In the foregoing embodiments of FIGS. 7 and 8, the latch and release assemblies 18 and 30 operate essentially as described above with reference to FIGS. 1 through 5. As illustrated in the cross-sectional side view and the top view of FIGS. 9 and 10, the status indicator 68 is disposed adjacent the structure of the modular device 12, such that the status indicator 68 does not interfere with the operation of the latch and release assemblies 18 and 30. However, incorporation of the status indicator 68 may require widening of the receptacle 14 or narrowing of the modular device 12. At a base 74 of the receptacle 14, the system 10 also may include a signal source 76 (e.g., a status light or electrical connector) disposed on the circuit board 52. For example, if the signal source 76 embodies a status light, then it would be positioned adjacent the signal transmission assembly 72 (e.g., a light pipe). A status signal may then be transmitted through the signal transmission assembly 72 to the status indicator light 70, which is viewable at the accessible section 32.

Figure 11:
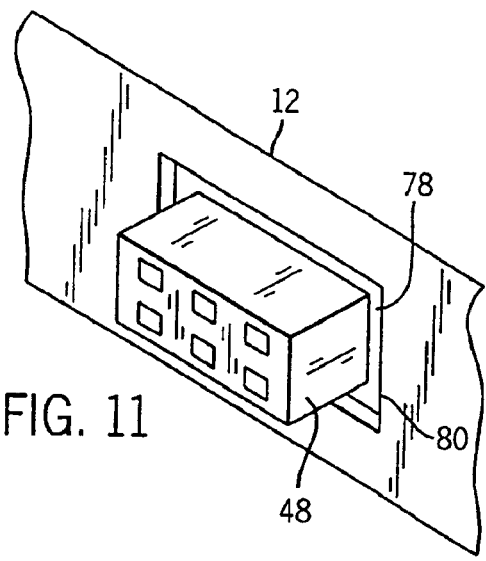
FIG. 11 is a perspective view of an exemplary movable connector for the system.
Figure 12:
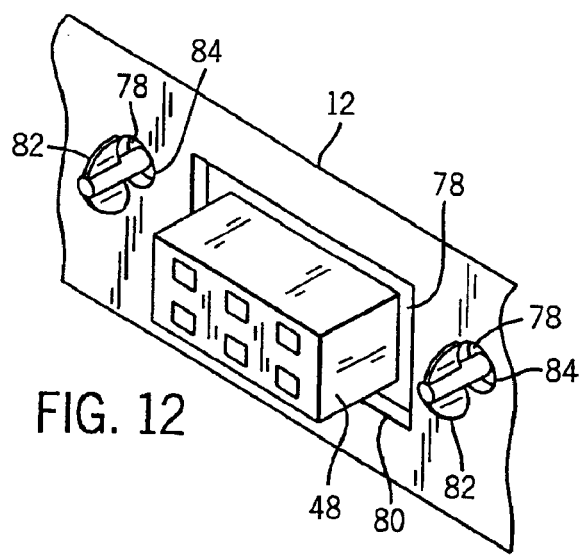
FIG. 12 is a perspective view of an exemplary movable connector and attachment members for the system.
Figure 13:
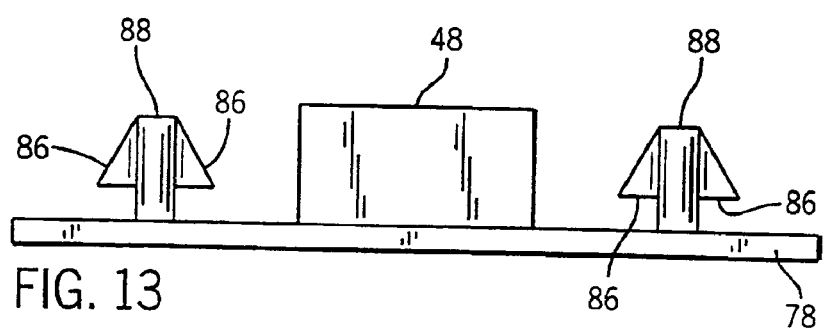
FIG. 13 is a side view of the movable connector and attachment members illustrated in FIG. 12.

As mentioned above, the electrical connectors 48 and 50 may have a semi-loose mount mechanism to facilitate a smooth mount and dismount, mate and unmate (e.g., a blind mating mechanism) of the modular device 12 and the corresponding electrical connection formed between the electrical connectors 48 and 50. For example, the electrical connector 48 may be disposed on a movable base 78 and have a substantially smaller geometry than a housing opening 80 in the modular device 12, as illustrated by the perspective view of FIG. 11. Accordingly, the electrical connector 48 may move within the housing opening 80, while the movable base 78 secures the electrical connector 48 within the modular device 12. The system 10 also may have movable attachment members to secure the movable base 78 to the modular device 12, as illustrated by the perspective view and side view of FIGS. 12 and 13, respectively. For example, tool free attachment members 82 may be coupled to the movable base 78 and extended through housing openings 84. In this exemplary embodiment, the tool free attachment members 82 have flexible wings 86 (e.g., conic-shaped wings) coupled to a central rod 88. The movable base 78 and the electrical connector 48 may then be removed from the modular device 12 by squeezing the flexible wings 86 and pushing the electrical connector 48 and tool-free attachment members 82 through the housing openings 80 and 84, respectively. Any other suitable movable attachment mechanism also may be used within the scope of the present technique. Moreover, the present technique may provide a reduced friction surface, a slider/drawer mechanism, a bearing mechanism, beveled connection edges, or a desired degree of tolerance between the modular device 12 and the receptacle 14 and between the electrical connectors 48 and 50 to facilitate a smooth intercoupling between the respective components, rather than using the foregoing moveable connection mechanism.

While the invention may be susceptible to various modifications and alternative forms, specific embodiments have been shown by way of example in the drawings and have been described in detail herein. However, it should be understood that the invention is not intended to be limited to the particular forms disclosed. For example, the present technique may be applied to a variety of computing systems, computing components, and other electronic and computing devices, each having various components and features. Moreover, a broad spectrum of electronic and communication technologies can be employed within the scope of the present technique. For example, wireless communication, blue tooth technologies, optical and digital technologies, and other emerging technologies are all within the scope of the present technique. Accordingly, the invention is intended to cover all modifications, equivalents, and alternatives falling within the spirit and scope of the invention as defined by the following appended claims.

What is claimed is:

1. An attachment system for a modular component of an electronic device, comprising:

a latch member configured for securing the modular component to the electronic device; and a release member movably coupled to the latch member, wherein the release member comprises a grip configured for bending the release member to effectuate a movement of the latch member to a released position, and wherein the release member is configured for mounting to an accessible side of the modular component and is rotatably coupled to the latch member.

2. The attachment system of claim 1, wherein the latch member comprises a flexible portion that is inwardly bendable with bending of the release member.

3. The attachment system of claim 1, wherein the latch member and the release member each comprise a fixed end configured for coupling to adjacent sides of the modular component.

4. The attachment system of claim 1, wherein the release member is bowable to a substantially curved geometry at the released position.

5. The attachment system of claim 1, wherein the latch member comprises metal and the release member comprises plastic.

6. The attachment system of claim 2, wherein the latch member comprises a fixed end and a free end adjacent the flexible portion.

7. The attachment system of claim 3, wherein the latch member and the release member are rotatably coupled at opposite ends from the fixed ends.

8. The attachment system of claim 3, wherein the latch member is configured for lateral mounting to the modular component.

9. A modular component for a computer system, comprising:
a modular housing comprising an accessible side and a lateral side;
a low profile latch coupled to the lateral side; and
a bowable and graspable release member coupled to the accessible side and hingedly coupled to the low profile latch.

10. The modular component of claim 9, wherein the modular housing comprises a cooling device.

11. The modular component of claim 9, wherein the modular housing comprises a memory device.

12. The modular component of claim 9, wherein the modular housing comprises electronic circuitry.

13. The modular component of claim 9, wherein the bowable and graspable release member is outwardly pullable and bowable to a narrower width dimension.

14. The modular component of claim 9, wherein the low profile latch comprises metal and the bowable and graspable release member comprises plastic.

15. The modular component of claim 12, wherein the electronic circuitry comprises an electrical plug movably coupled to the modular housing.

16. The modular component of claim 13, wherein the low profile latch is inwardly releasable with bowing of the bowable and graspable release member.

17. A mounting apparatus, comprising:
a tool-free coupling movable between secured and released positions; and
a bending-activated release rotatably coupled to the tool-free coupling and configured to move the tool-free coupling between the latched and released positions in both directions;
wherein the bending-activated release and the tool-free coupling comprise first and second low-profile flexible members disposed in first and second planes, respectively.

18. The mounting apparatus of claim 17, wherein the tool-free coupling comprises an elongated flexible member having a latch.

19. The mounting apparatus of claim 17, wherein the bending-activated release is disposed in a first plane and the tool-free coupling is disposed in a second plane inaccessible from the first plane during mounting.

20. The mounting apparatus of claim 17, wherein the first and second low-profile flexible members each comprise a fixed end and a movable end, wherein the movable ends are coupled near the intersection of the first and second planes.

21. The mounting apparatus of claim 18, wherein the elongated flexible member comprises a substantially flat structure having a fixed end and a movable end coupled to the bending-activated release.

22. A mounting method, comprising:
providing a tool-free coupling substantially located at a first side of a device and operable at an inaccessible interface between the device and a mounting receptacle;
providing a flex-activated release substantially located at a second side of the device and configured to facilitate disengagement of the tool-free coupling, wherein the second side is different than the first side; and
mounting a plurality of redundant cooling fans each having the tool-free coupling and the flex-activated release.

23. The mounting method of claim 22, comprising mounting the device in the mounting receptacle.

24. The mounting method of claim 22, comprising mounting a plurality of computer components in adjacent mounting receptacles, wherein each of the computer components comprises the tool-free coupling and the flex-activated release.

25. The mounting method of claim 22, comprising dismounting the device from the mounting receptacle via flexing the flex-activated release to disengage the tool-free coupling.

26. The mounting method of claim 22, wherein providing the flex-activated release comprises providing the flex-activated release hingedly coupled to the tool-free coupling.

27. The mounting method of claim 25, wherein flexing comprises manually inducing bowing of the flex-activated release to provide a lateral displacement corresponding to a reduced width of the flex-activated release.

28. The mounting method of claim 25, wherein flexing comprises pulling the flex-activated release.

29. The mounting method of claim 28, wherein pulling comprises moving the tool-free coupling to a disengaged position and providing a removal force to remove the device from the mounting receptacle.

* * * * *

UNITED STATES PATENT AND TRADEMARK OFFICE
CERTIFICATE OF CORRECTION

PATENT NO. : 7,167,371 B2
APPLICATION NO. : 10/630565
DATED : January 23, 2007
INVENTOR(S) : Henry C. Coles et al.

Page 1 of 1

It is certified that error appears in the above-identified patent and that said Letters Patent is hereby corrected as shown below:

On the face page, in field (56), under "U.S. Patent Documents", in column 2, line 1, below "5,829,601 A * 11/1998 Yurchenco et al. 211/41.17" insert -- 5,978,212 A * 11/1999 Boulay et al. 361/685
6,256,204 B1 * 7/2001 Wormsbecher et al. 361/727 --.

In column 6, line 65, in Claim 8, delete "claim 3" and insert -- claim 6 --, therefor.

Signed and Sealed this

Twenty-first Day of July, 2009

JOHN DOLL
*Acting Director of the United States Patent and Trademark Office*